Nov. 22, 1966

H. SCHARLA-NIELSEN 3,287,654

RADIO FREQUENCY TUNER

Filed Jan. 31, 1962

INVENTOR
HANS SCHARLA-NIELSEN

BY Hurvitz and Rose
ATTORNEYS

United States Patent Office 3,287,654

Patented Nov. 22, 1966

3,287,654

RADIO FREQUENCY TUNER

Hans Scharla-Nielsen, Indialantic, Fla., assignor to Radiation Incorporated, Melbourne, Fla., a corporation of Florida Filed Jan. 31, 1962, Ser. No. 170,145
8 Claims. (Cl. 330—53)

This invention relates to a radio frequency tuner, and more particularly to a radio frequency tuner of the type wherein both the capacitance and inductance are continuously varied throughout the entire frequency range of the tuner in response to the movement of one tuning element.

It is difficult to design a radio frequency tuner, particularly for the very high frequency range, which possesses a wide tuning range, does not require ohmic contacts, does not break down under conditions of high R-F potential, and which is tunable over a frequency range by means of continuously varying both the capacitance and inductance simultaneously. For example, a V.H.F. radio frequency tuner may operate properly at high voltages in normal sea level conditions but may break down at higher altitudes where the air is rarefied, particularly at the high impedance values of the tuner. In compensating for the deleterious effects of high altitudes it has been necessary in the past to reduce the frequency range of the tuner to eliminate the possibility of high voltage breakdown, in the range of high impedance to R-F.

It is a broad object of the present invention to provide a novel tuner turnable over a wide range of frequencies, particularly in the V.H.F. band, which does not break down under trying conditions of environment such as rarefied atmosphere, the capacitance effects of the tuner being greater in positions of higher impedance and the inductive effects being greater at positions of lower impedance.

In one form of the present invention, the tuner of the invention is connected to the output electrode of a 4CX300A Eimac stacked ceramic tetrode and forms an output tank circuit therefor. The output tank circuit of the present invention includes a metallic stationary tuning element cylindrical in form and the wall of which continuously varies in height from a lower end to a higher end. The end of the stationary tuning element having lower height is grounded and the other end, of greatest height is electrically connected to the output circuit of a component such as an output amplifier tube. A grounded metallic tuning element which may be in the form of a hollow half cylinder is located to be rotatable about an axis coaxial with or offset from the axis of the variable height stationary tuning element. The stationary variable height tuning element is inductively coupled to a grounded output loop. Rotation of the half-cylinder into proximity with the higher end of the stationary tuning element results in maximum capacitance and inductance to ground to produce the lower resonant frequencies of the tuner, and the rotation of the half-cylinder to a position in proximity to the lower end of the stationary tuning element results in minimum capacity and a reduced inductance to ground due to eddy current shielding effects, thereby producing the higher resonant frequencies in the range of the tuner. If the half-cylinder is positioned to be rotated about an axis offset from the axis of the stationary element so that the half-cylinder may be rotated to be closer to the low end and further from the high end of the variable height stationary tuning element, the breakdown voltage of the tuner is considerably raised without substantially affecting the frequency range of the tuner.

In another form of the present invention the walls of the hollow half-cylinder rotatable tuning element may be of varying height also, the height thereof increasing in a direction opposite to the direction of increasing height of the stationary tuning element. When the variable height rotatable tuning element is positioned opposite the lower height end of the stationary tuning element, there is greater eddy current shielding of the stationary tuning element thus further reducing the inductance and permitting tuning to higher frequencies.

It is, accordingly, an object of the present invention to provide a radio frequency tuner in which the capacitance and inductance are varied simultaneously throughout the frequency range of the tuner.

Another object of the present invention is the provision of a V.H.F. radio frequency tuner in which both the capacitance and inductance are varied simultaneously throughout the frequency range of the tuner by the movement of one tuning element.

Yet another object of the invention is to provide a V.H.F. radio frequency tuner which may operate at high voltages without breakdown and which has no ohmic contact in the variable tuning thereof.

These and other objects and features of the present invention will be better understood by referring to the drawings in which.

Figure 1:
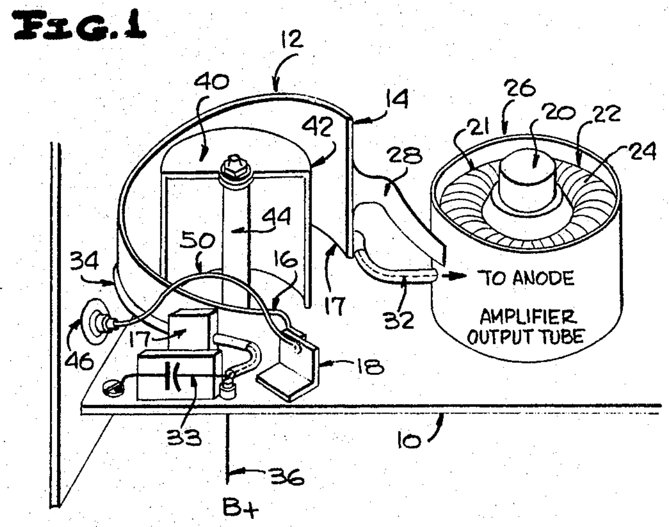
FIGURE 1 is a modified illustration of the tuner of the invention in perspective.
Figures 2, 3, 4:
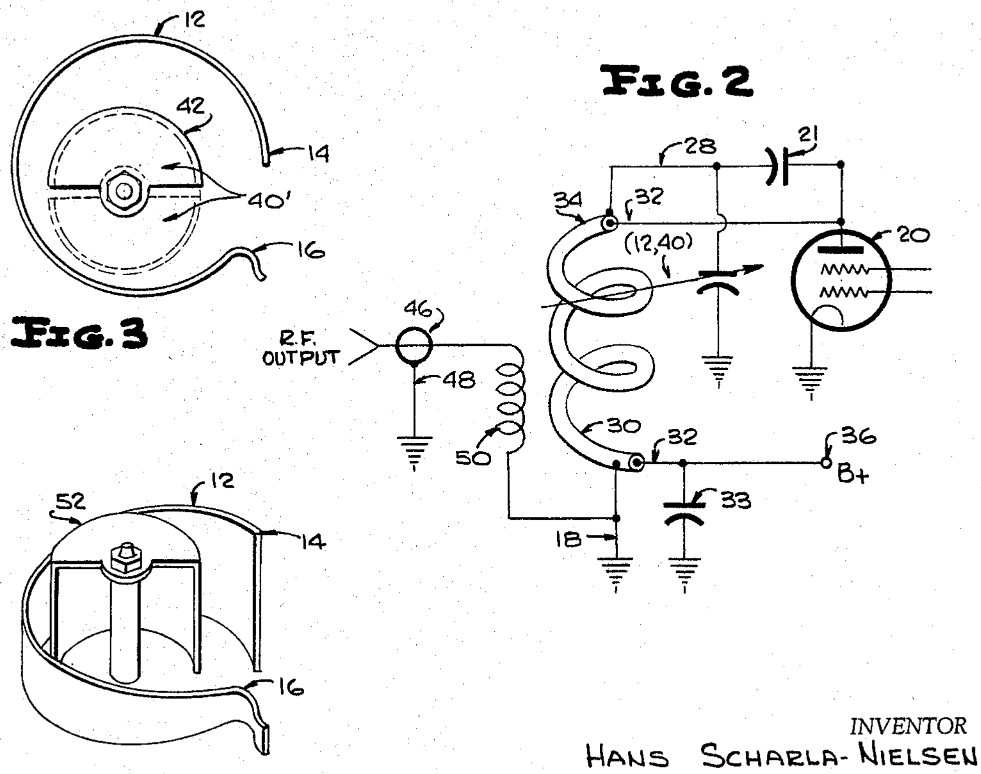
FIGURE 2 is a modified schematic diagram of the tuner of the invention.
FIGURE 3 is a top view of an embodiment of the tuning elements of the invention.
FIGURE 4 is a side view of another embodiment of the tuning elements according to the invention.

Referring to FIGURES 1 and 2, the numeral 10 indicates a chassis on which the tuner according to the invention is mounted. The tuner includes a metallic stationary element 12 in the form of a cylinder portion having a wall of variable height. The high end of the stationary element is indicated at 14 and the low end at 16. The low end of the stationary element 12 is electrically connected to a grounded terminal 18 as by soldering or other suitable means. The stationary element is mechanically supported by insulated blocks indicated at 17.

The numeral 20 indicates an amplifier output tube of relatively high power such as a 4CX300A Eimac stacked ceramic tetrode which may produce 50 watts of output power, for example. Other types of tubes may be used, however. As shown in FIGURE 1, the tube 20 includes a clamping capacitor 21 formed of a low loss insulating medium, such as Teflon, indicated at 22, a radiator indicated at 24, and a metallic clamp 26.

A strip of metal 28 integral with the stationary tuning element 12 is electrically connected as by soldering or welding to the clamp 26.

A coaxial line 30 has an insulated inner conductor 32 and a bare outer conductor 34. The outer conductor 34 of the coaxial line 30 is electrically connected by suitable means such as welding or soldering throughout its length to the lower end of the stationary tuning element 12. The outer conductor 34 is approximately of the same length as the lower periphery of the stationary element 12. For purposes of convenience, in FIGURE 2 only the coaxial line 30 is shown, it being understood that both the outer conductor 34 and the tuning element 12 form a conductive path for the output of the tube 20.

The inner conductor 32 of the coaxial line 30 is electrically connected at one end thereof to a source of biasing potental (B+) indicated at 36. A by pass capacitor 33 for the biasing potential 36 is also connected to said one end of the inner conductor 32. The other end of the inner conductor 32 is electrically connected to the anode of the tube 20, the inner conductor 32 thereby providing in a convenient compact manner a conductive path from the biasing source 36 to the plate of the tube 20.

A rotatable tuning element 40 is mounted on the chassis 10 and may be positioned to rotate about an axis coaxial with that of the stationary element 12 or, as shown at 40′ in FIGURE 3, may be positioned to rotate about an axis offset from that of the stationary element 12. The rotatable tuning element 40 may be in the form of a hollow half-cylinder the outer surface of which is indicated at 42 and the supporting shaft of which is indicated at 44. The rotating element 40 is electrically grounded to the chassis 10 at the bottom of the shaft 44.

An output connector 46 is suitably mounted on a wall of the chassis 10, said connector 46 being D.C. grounded through a grounded lead 48 as indicated in FIGURE 2. An output coupling loop 50 is connected at one end to the output connector 46 and at the other end to the grounded terminal 18. The output coupling loop 50 is positioned such that it is inductively coupled to at least a portion of the stationary tuning element 12.

Referring to the embodiment of FIGURE 4, according to the invention the rotatable tuning element may also be of varying height increasing in a direction opposite to that of the stationary element 12. In FIGURE 4, a variable height rotating element is indicated at 52, and the element may be positioned coaxially with, or offset from, the axis of the stationary tuning element 12.

In operation, the amplified radio frequency energy appearing at the plate of the tube 20 is coupled to the stationary tuning element 12 through the conductive strip 28. Since the outer conductor 34 of the coaxial line 30 is electrically connected throughout its length to the stationary tuning element 12, both the outer conductor 34 and the walls of the stationary tuning element 12 form a conductive path for the R.-F. energy from the tube 20. The lower end 16 of the stationary tuning element 12 is D.C. grounded to the chassis at 18.

When the rotatable tuning element 40 is positioned so that its surface 42 is in proximity to the higher end 14 of the stationary tuning element 12, the amount of surface area mutually presented by the surface 42 to the surface area of the wall of the stationary tuning element 12 is at a maximum, thereby effecting a maximum capacitance at R.-F. frequencies between the stationary tuning element 12 and ground, to which the rotatable element 40 is connected, and also effecting a maximum inductance between the tuning elements 12 and 40, and the output coupling loop 50 because the rotatable tuning element provides a minimum of eddy current shielding of the stationary tuning element 12. Thus, in the foregoing position of the tuning element 12 and 50 proivding maximum capacity and inductance, according to the equation $$f=\frac{1}{2\pi\sqrt{LC}}$$

where $f$ is the frequency and L and C the inductance and capacitance of a tank circuit, the frequency $f$ is at a minimum.

As the rotatable tuning element 40 is rotated so that there is a continuously decreasing mutually opposing area between the surface 42 of the rotatable tuning element 40 and the wall of the variable height stationary element 12, the capacity therebetween decreases. The effect of eddy current shielding between the stationary tuning element 12 and the output coupling loop 50 increases as the rotating tuning element 40 is rotated toward the lower end 16 of the stationary tuning element 12, thus decreasing the inductance between the stationary tuning element 12 including the outer conductor 34 and ground.

The inductance and capacitance of the tuner is at a minimum when the rotatable tuning element 40 is in proximity to the lower end 16 of the stationary element 12 thereby producing the highest frequency output of the tuner. The tuner output is coupled inductively to the output loop 50 which is also D.C. grounded to the chassis 10 at the connector 46 through the ground lead 48.

The embodiment of the R.-F. tuner according to the invention shown in FIGURE 3, wherein the rotatable tuning element 40′ is positioned to rotate about an axis offset from that of the stationary tuning element 12, reduces the maximum capacitance slightly when the rotatable tuning element 40, is in proximity to the upper end 14 of the variable height stationary tuning element 12. But the increased distance of the surface 42 from the wall of the tuning element 12 permits the tuner to operate at considerably higher R.-F. voltage swings without capactive breakdown, especially in conditions of rarefied atmosphere. A further enhanced performance in the offset arrangement of FIGURE 3 results from the increased shielding of eddy currents when the rotatable tuning element 40′ is in proximity to the lower end 16 of the variable height stationary tuning element 12, thus permitting the tuning to higher frequencies and an overall increase in the tunable frequency band.

In the embodiment of the invention shown in FIGURE 4, the rotatable tuning element 52 is a variable height, the height thereof increasing in a direction opposite to the direction of increasing height of the stationary tuning element 12. The maximum capacitance of the tuner is approximately the same as that shown in FIGURE 1; however the shielding of eddy currents is considerably greater than that of FIGURE 1 because of the added shielding area of the rotatable tuning element 52 presented to the wall of the stationary tuning element 12 as the element 52 is rotated toward the lower end 16 of the stationary tuning element 12. The resulting decreased inductance of the element 12 including the outer conductor 34 electrically connected thereto permits tuning to higher frequencies.

The variable height rotatable tuning element 52 shown in FIGURE 4 may be offset from the axis of the stationary tuning element 12 in the manner shown in FIGURE 3. The result is an even further decrease in the inductance at the high frequency end of the tuner (i.e. when the surface of the variable height rotatable tuning element 52 is in proximity to the lower height end 16 of the stationary tuning element 12). Also, the level of voltage at which breakdown may occur is increased at the lower frequency end of the tuner (i.e. when the surface of the variable height rotatable tuning element 52 is in proximity to the higher height end 14 of the stationary tuning element 12).

While the system of the invention has been disclosed in the form of an R.-F. tuner, the structure and circuitry thereof may be adapted for use as an oscillator by providing a regenerative feedback loop from the output coupling loop to a point in the circuit previous to the tube 20.

Although I have described the invention in the various forms and embodiments thereof, it is clear that variations and modifications in the details of form and of constructions of my invention which have been specifically shown and described may be resorted to without departing from the spirit and scope of the invention as defined in the following appended claims:

What is claimed is:

1. A radio frequency tuner comprising a first metallic tuning element of generally cylindrical shape and having a discontinuity of substantial length in its wall defining a pair of ends of said wall, means, for coupling a R.F. voltage source to one end of said wall, the other end of said wall being connected to a point of R.-F. reference potential, a second metallic tuning element connected to said reference potential and being generally concentric with said first tuning element, said second element being of generally semi-cylindrical shape, one of said elements being rotatable at will about its axis relative to the axis of the other element, the wall of at least one of said elements continuously varying from a maximum to a minimum height along its circumference, said elements being relatively movable to spaced locations so that the distance between and area of opposing surfaces between them is continuously variable to thereby continuously vary both the inductance and capacity between the ends of said first element.

2. The apparatus according to claim 1 wherein said first metallic tuning element is stationary and in the form of a wall having a continuously varying height, the portion of said wall having the largest height being coupled to said source of R.-F. voltage, and the portion of said wall having the least height being connected to said reference potential, said second tuning element being located interiorly of said first tuning element.

3. The tuner of claim 2 further including output means inductively coupled with a portion of said first tuning element.

4. The tuner of claim 3 wherein the axes of said tuning elements are offset relative to each other, the heights of said tuning elements and the offset positions of said axes being such that the minimum area is between said elements when they are rotated in closest proximity to each other.

5. The tuner according to claim 2 wherein the cylindrical wall of said second tuning element is of continuously varying height, increasing from a low end to a high end in a direction opposite to the direction of increasing height of said first tuner element.

6. The tuner of claim 1 wherein the axes of said tuning elements are coincident.

7. The tuner of claim 1 wherein the axes of said tuning elements are offset relative to each other, the heights of said tuning elements and the offset positions of said axes being such that minimum area is between said elements when they are rotated in closest proximity to each other.

8. The tuner of claim 1 wherein said R.-F. voltage source includes an electrode of an amplifying device, a source of D.C. biasing voltage for said electrode, and a coaxial line having a bare outer conductor electrically connected to said first tuning element and an insulated inner conductor connected at one end to said source of biasing voltage and at the other end to said electrode, and means for only A.C. coupling R.-F. voltage between said one end of said first element and said electrode.

References Cited by the Examiner

UNITED STATES PATENTS

| | | | |
|---|---|---|---|
| 2,421,725 | 6/1947 | Stewart | 331—96 |
| 2,483,893 | 10/1949 | Everett | 334—67 |
| 2,578,429 | 12/1951 | Karplus | 334—41 |
| 2,642,539 | 6/1953 | Lichtman | 330—53 |
| 2,727,148 | 12/1955 | Slate | 334—67 |

ROY LAKE, *Primary Examiner.*